US009024284B2

(12) United States Patent
Oyanagi et al.

(10) Patent No.: US 9,024,284 B2
(45) Date of Patent: May 5, 2015

(54) SUPERLATTICE PHASE CHANGE MEMORY INCLUDING SB2TE3 LAYERS CONTAINING ZR

(71) Applicant: Hitachi, Ltd., Chiyoda-ku, Tokyo (JP)

(72) Inventors: Takasumi Oyanagi, Tokyo (JP); Norikatsu Takaura, Tokyo (JP); Mitsuharu Tai, Tokyo (JP); Masaharu Kinoshita, Tokyo (JP); Takahiro Morikawa, Tokyo (JP); Kenichi Akita, Tokyo (JP); Masahito Kitamura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/091,487

(22) Filed: Nov. 27, 2013

(65) Prior Publication Data

US 2014/0151622 A1 Jun. 5, 2014

(30) Foreign Application Priority Data

Nov. 30, 2012 (JP) ................................. 2012-262080

(51) Int. Cl.
*H01L 29/02* (2006.01)
*H01L 45/00* (2006.01)
*H01L 27/24* (2006.01)

(52) U.S. Cl.
CPC .......... *H01L 45/144* (2013.01); *H01L 45/1233* (2013.01); *H01L 45/1675* (2013.01); *H01L 27/2409* (2013.01); *H01L 27/2463* (2013.01); *H01L 45/065* (2013.01)

(58) Field of Classification Search
CPC ....................................................... H01L 45/00

USPC ............................................................. 257/2
See application file for complete search history.

(56) References Cited

U.S. PATENT DOCUMENTS

| 8,335,106 | B2 * | 12/2012 | Aizawa et al. ................ 365/174 |
| 8,803,119 | B2 * | 8/2014 | Morikawa et al. ................ 257/2 |
| 2010/0109111 | A1 * | 5/2010 | Shin et al. ..................... 257/421 |
| 2010/0207090 | A1 * | 8/2010 | Tominaga et al. ................ 257/2 |
| 2010/0284218 | A1 * | 11/2010 | Aizawa et al. ................ 365/174 |
| 2010/0315867 | A1 * | 12/2010 | Aizawa et al. ................ 365/163 |
| 2011/0089508 | A1 * | 4/2011 | Min et al. ...................... 257/421 |
| 2011/0151277 | A1 * | 6/2011 | Nishihara et al. ............. 428/697 |
| 2012/0091423 | A1 * | 4/2012 | Sumino ............................ 257/4 |
| 2013/0029456 | A1 * | 1/2013 | Hunks et al. .................. 438/102 |
| 2013/0071653 | A1 * | 3/2013 | Kojima et al. ................ 428/336 |
| 2013/0221310 | A1 * | 8/2013 | Morikawa et al. ................ 257/2 |
| 2013/0306927 | A1 * | 11/2013 | Marsh et al. ..................... 257/2 |
| 2014/0220733 | A1 * | 8/2014 | Hunks et al. .................. 438/102 |

OTHER PUBLICATIONS

Simpson, R.E. et al., "Interfacial phase-change memory", Nature Nanotechnology, vol. 6, 2011, pp. 501-505.

* cited by examiner

*Primary Examiner* — Caleb Henry
(74) *Attorney, Agent, or Firm* — Miles & Stockbridge P.C.

(57) ABSTRACT

A superlattice phase change memory capable of increasing a resistance in a low resistance state is provided. The phase change memory includes a first electrode, a second electrode provided on the first electrode, and a phase change memory layer having a superlattice structure between the first electrode and the second electrode, the superlattice structure including to repeatedly formed layers of $Sb_2Te_3$ and GeTe. The phase change memory layer having the superlattice structure includes a $Sb_2Te_3$ layer containing Zr in contact with the first electrode.

15 Claims, 13 Drawing Sheets

US 9,024,284 B2

SUPERLATTICE PHASE CHANGE MEMORY INCLUDING SB2TE3 LAYERS CONTAINING ZR

CLAIM OF PRIORITY

The present application claims priority from Japanese patent application JP 2012-262080 filed on Nov. 30, 2012 the content of which is hereby incorporated by reference into this application.

BACKGROUND OF THE INVENTION

1. Field of the Invention

The present invention relates to a phase change memory that can store information and electrically rewrite the information by using a material that has a current resistance value fluctuating with a structural change caused by a phase change in response to the passage of current through a device.

2. Description of the Related Art

Solid storages for recording data in NAND flash memories feature high-speed access, high data transfer rates, and low power consumption and thus have received attention as next-generation storage devices. Memory devices have been reduced in size in order to produce solid storages with larger capacities. It is expected that coupling between adjacent memory devices may saturate a storage density in the near future, requiring solid storages with high speeds and large capacities instead of NAND flash memories.

Resistive random access memories having been earnestly studied as next-generation solid storages include a phase change memory composed of a chalcogenide material that is a recording material. The basic structure of a memory cell, that is, a phase change memory device, contains a recording material between metal electrodes. A phase change memory is a resistive random access memory that stores information by using varying resistance states of a recording material between electrodes.

The phase change memory cell stores information according to the resistance value of a recording material composed of phase change materials such as $Ge_2Sb_2Te_5$, the resistance value changing between an amorphous state and a crystalline state. The recording material has a high resistance in an amorphous state and has a low resistance in a crystalline state. Thus, information is read by determining a potential difference across a memory cell, measuring a current passing through the memory cell, and identifying whether the memory cell is in a high resistance state or a low resistance state.

In recent years, a theory of a phase change memory controllable only by transferring Ge atoms has been proposed. A phase change memory based on this theory is disclosed in "Interfacial phase-change memory", Nature Nanotechnology Vol. 6 p. 501-505 (2011), R. E. Simpson and 6 others. The memory having a superlattice structure of alternately stacked GeTe and $Sb_2Te_3$ layers switches between a high-resistance crystalline state and a low-resistance crystalline state. The phase change memory having the superlattice structure can switch at a lower current than a conventional phase change memory composed of phase change materials such as $Ge_2Sb_2Te_5$, thereby reducing power consumption.

A reduction in the operating current and power of a phase change memory cell is an important factor of technical development. If the operating current of the phase change memory cell can be reduced, switches for selecting the memory cells of, for example, MOS transistors and diodes can be reduced in size, thereby increasing the density and speed of a solid storage. Furthermore, if the operating power of the phase change memory cell can be reduced, a solid storage with the phase change memory cell is applied to a storage class memory for mobile and home PCs (a high-speed memory capable of compensating for a performance gap between a cash memory such as DRAM and an external storage to improve the performance of a device and reduce power consumption), thereby effectively reducing the power consumption of these devices. Rewriting of data (a resetting operation in particular) requires at least 60% of the operating current and power consumption of the phase change memory cell. Thus, it is important to reduce a current and power required for the resetting operation.

The resetting operation corresponds to an increase in resistance in the phase change memory cell. Thus, an increase in resistance in the superlattice phase change memory cell can achieve lower power.

SUMMARY OF THE INVENTION

An object of the present invention is to provide a superlattice phase change memory that can increase a resistance in a low resistance state.

In order to address the problem, a phase change memory cell according to an aspect of the present invention includes: a substrate having a semiconductor device and an insulating film on a surface of the substrate;
a first electrode provided on the substrate;
a second electrode provided on the first electrode; and
a phase change memory layer having a superlattice structure between the first electrode and the second electrode, the superlattice structure including repeatedly formed layers of $Sb_2Te_3$ and GeTe,
wherein the phase change memory layer having the superlattice structure is in contact with the first electrode and includes the $Sb_2Te_3$ layers containing Zr.

A phase change memory including:
a first electrode;
a phase change memory layer having a superlattice structure on the first electrode, the phase change memory layer including repeatedly formed layers of $Sb_2Te_3$ and GeTe; and
a second electrode formed on the phase change memory layer having the superlattice structure,
wherein the phase change memory layer having the superlattice structure includes the $Sb_2Te_3$ layers in contact with the first electrode and the GeTe layers in contact with the second electrode, and
at least one of the $Sb_2Te_3$ layers contains Zr.

An embodiment of the present invention can provide a superlattice phase change memory that can increase a resistance in a low resistance state.

DETAILED DESCRIPTION OF THE INVENTION

The inventors et al, examined a solution to low efficiency in a low resistance state and found that in a phase change memory having a superlattice structure including alternately stacked layers of GeTe and $Sb_2Te_3$, the $Sb_2Te_3$ layer is preferably formed in contact with a lower electrode and contains Zr. The present invention has been devised based on this finding. A phase change memory having a superlattice structure including alternately stacked layers of GeTe and $Sb_2Te_3$ has a triple-digit ON/OFF resistance ratio and thus a one-digit increase in resistance in a low resistance state is negligible in reading in an ON/OFF state.

Embodiments of the present invention will be described below with reference to the accompanying drawings.

First Embodiment

Referring to FIGS. 1, 2, 3A, 3B, 4, and 5A to 5H, a first embodiment of the present invention will be described below.

Figure 1:
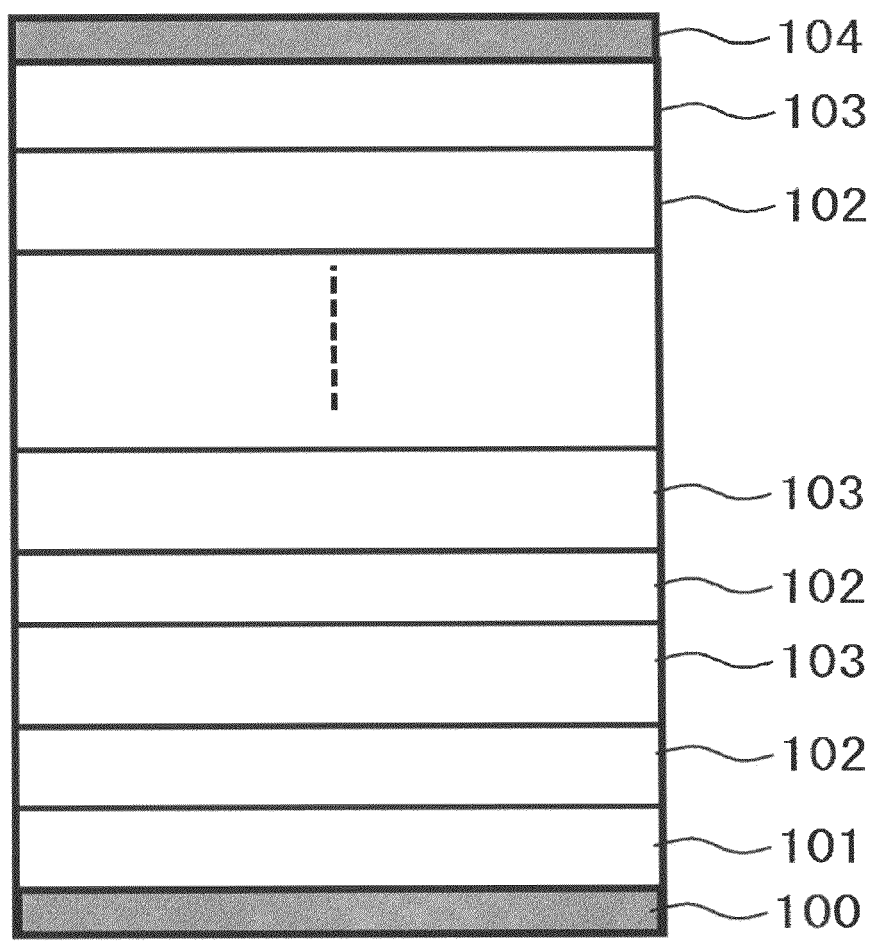
FIG. 1 is a cross-sectional view illustrating a superlattice structure in a phase change memory according to a first embodiment of the present invention.

FIG. 1 is a cross-sectional view illustrating a lower electrode 100 and an upper electrode 104 as an example of a superlattice structure in a phase change memory according to the present embodiment. In the present embodiment, the lower electrode 100 is made of, for example, tungsten or titanium nitride and includes a composite membrane thereof. A $Sb_2Te_3$ layer 101 containing Zr is formed in contact with the lower electrode 100. Since Zr is unstable, $ZrO_2$ (zirconia) or YSZ (yttria-stabilized zirconia) is added to the $Sb_2Te_3$ layer containing Zr. A GeTe layer 102 in contact with the $Sb_2Te_3$ layer 101 containing Zr and a $Sb_2Te_3$ layer 103 in contact with the GeTe layer 102 are formed in a pair. Furthermore, the GeTe layer 102 and the $Sb_2Te_3$ layer 103 are repeatedly provided so as to form a so-called superlattice structure. The upper electrode 104 is formed in contact with the $Sb_2Te_3$ layer 103. The $Sb_2Te_3$ layer 103 may contain Zr or no additional materials. The operating principle of the superlattice phase change memory is that the transfer of Ge atoms in the GeTe layer switches the overall membrane between a high resistance state and a low resistance state. According to the principle, the addition of any materials to the GeTe layer may interfere with the transfer of Ge. Thus, the GeTe layer needs to be free from intentionally added impurities.

Moreover, the $Sb_2Te_3$ layer and the GeTe layer need to be evenly deposited to form the phase change memory having the superlattice structure. However, an inventors' examination proved that the $Sb_2Te_3$ layer 101 in contact with a first electrode (lower electrode) is highly likely to coagulate. If the $Sb_2Te_3$ layer 101 is smaller than 1 nm in thickness, the layer is formed like an island, whereas if the $Sb_2Te_3$ layer 101 is larger than 20 nm in thickness, the layer considerably coagulates and thus it is difficult to form a superlattice structure. For this reason, the $Sb_2Te_3$ layer 101 containing Zr in contact with the first electrode desirably has a thickness of 1 nm to 20 nm.

Figure 3A:
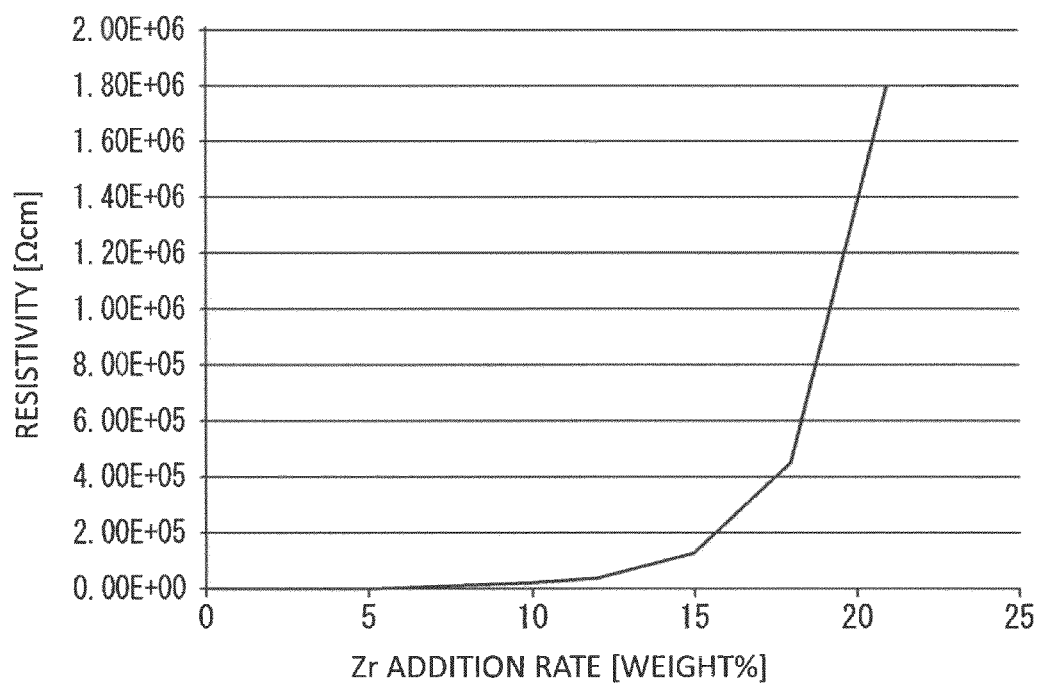
FIG. 3A shows the dependence of resistivity of a $Sb_2Te_3$ layer on an amount of YSZ added to the $Sb_2Te_3$ layer.
Figure 3B:
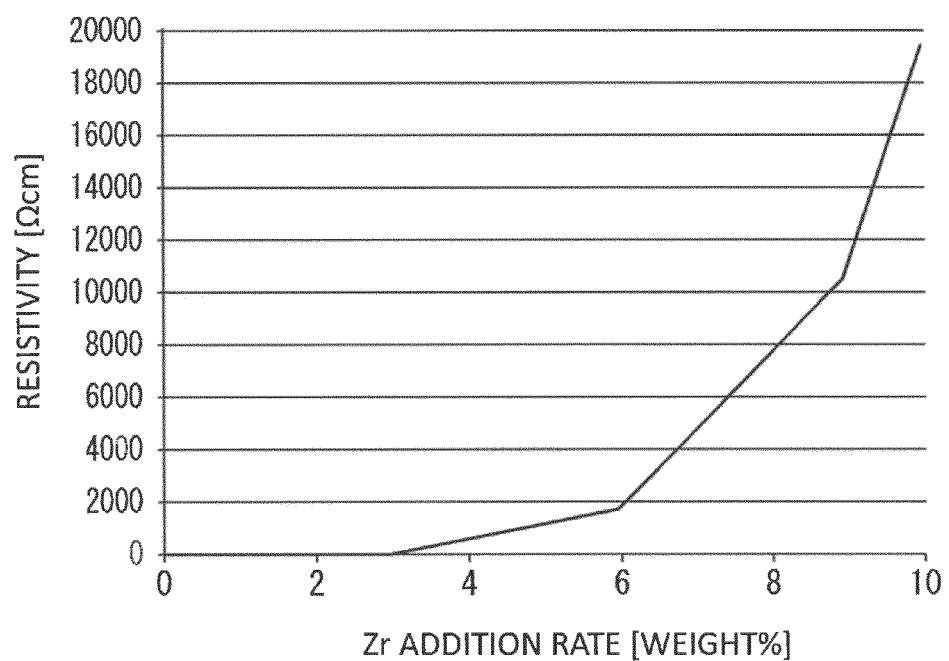
FIG. 3B is an enlarged view of an added amount of YSZ from 0 wt % to 10 wt % in FIG. 3A.

FIG. 3A shows a change of resistivity relative to an amount of YSZ added to the $Sb_2Te_3$ layer. As shown in FIG. 3A, the resistivity increases with the amount of YSZ. FIG. 3B is an enlarged view of an added amount of YSZ from 0 wt % to 10 wt % in FIG. 3A. FIG. 3A shows that an added amount of 5 wt % changes resistivity by at least three digits (1000 times) while an added amount of 10 wt % changes resistivity by at least four digits (10000). The use of the $Sb_2Te_3$ layer 101 containing YSZ can increase a resistance value in a low resistance state, thereby reducing a reset current. For example, in the case where 10 wt % of Zr is added to the $Sb_2Te_3$ layer, the resistivity is about ten times larger than in the related art (Zr is not added). An amount Y of Zr to be added is expressed by 0 wt %<Y<20 wt % but is preferably expressed by 0 wt %<Y<10 wt %. The addition of Zr increases the resistivity but an extremely large amount of Zr may considerably fluctuate the resistivity, thereby reducing the controllability of a resistance value. Since the $Sb_2Te_3$ layer 101 is a superlattice first layer, the GeTe layer 102 and the $Sb_2Te_3$ layer 103 that are deposited on the $Sb_2Te_3$ layer 101 can undergo crystal growth at a temperature of at least 150° C., thereby increasing the resistivity in conformity with a superlattice. The phase change memory having a superlattice structure is obtained thus. Thus, in the first embodiment, $ZrO_2$ and YSZ are added to the $Sb_2Te_3$ layer 101 in contact with the lower electrode 100. Moreover, the resistivity can be controlled by partially or entirely adding $ZrO_2$ or YSZ to the $Sb_2Te_3$ layer 103 disposed on the GeTe layer 102. Alternatively, $ZrO_2$ or YSZ may be added partially or entirely to the $Sb_2Te_3$ layer 103 disposed on the GeTe layer 102, instead of the $Sb_2Te_3$ layer 101. This can control the resistivity. The setting of a high resistance value can reduce a reset current, leading to lower power consumption. Moreover, the amount of Zr added to the multiple $Sb_2Te_3$ layers 103 can be reduced in each of the layers. This can reduce deterioration of crystallinity in each of the layers and reduce the diffusion of matters added to the GeTe layer 102 next to the $Sb_2Te_3$ layer 103. In the case where $ZrO_2$ or YSZ is not added to the $Sb_2Te_3$ layer 101, a $Sb_2Te_3$ layer can be formed with higher crystallinity on the lower electrode. Moreover, an equal amount of Zr is added to each of the $Sb_2Te_3$ layers, achieving a superlattice structure with uniform crystallinity.

Figure 2:
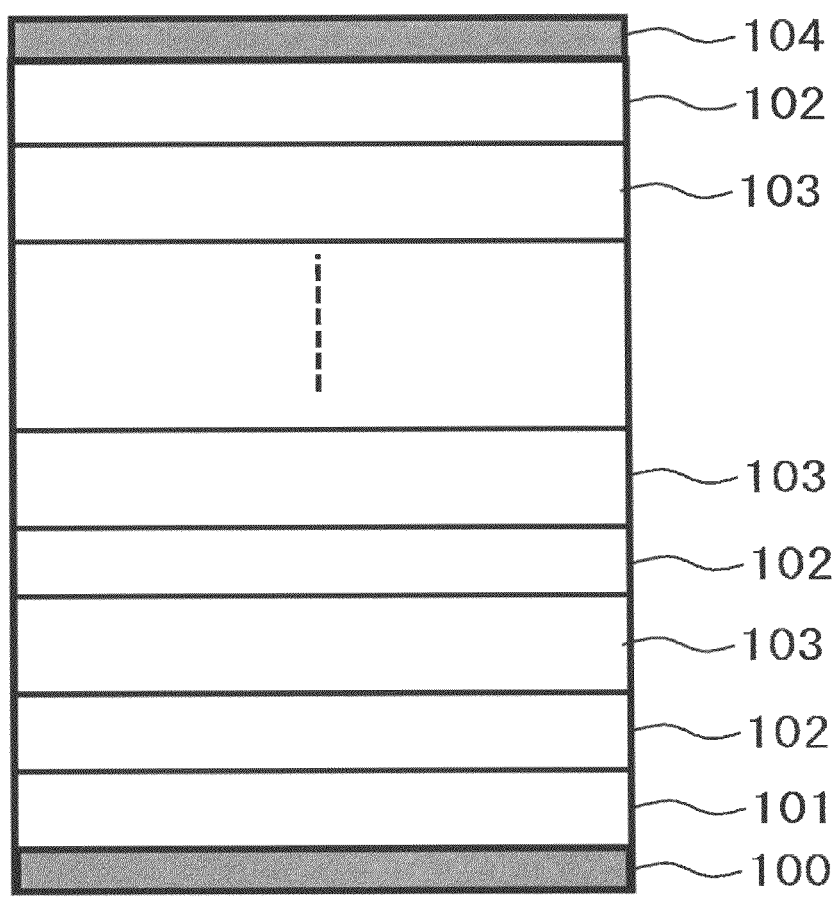
FIG. 2 is a cross-sectional view illustrating a superlattice structure in a phase change memory according to a second embodiment of the present invention.
Figure 4:
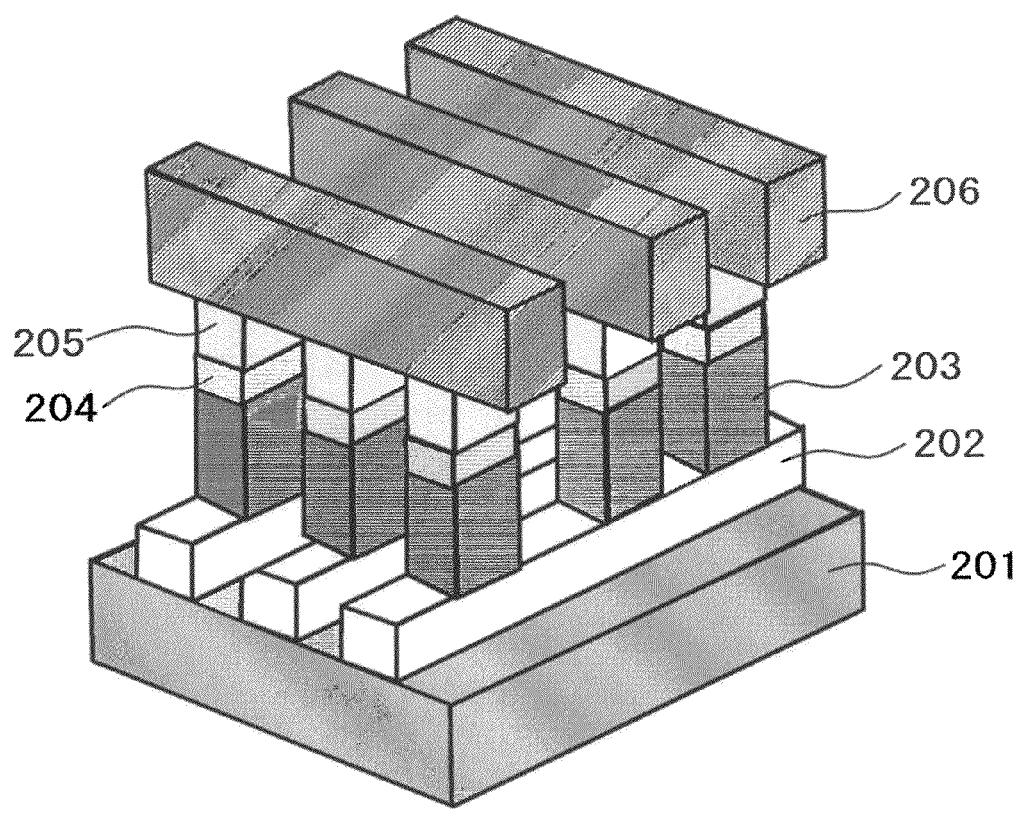
FIG. 4 is a bird's eye view of a structure of a memory array in the phase change memory according to the first embodiment of the present invention.

FIG. 4 is a bird's eye view of a structure of a memory array in the phase change memory provided with pin diodes serving as selective elements according to the present embodiment. For example, an insulating film 201 may be a silicon oxide film formed on a semiconductor substrate. The insulating film 201 contains a circuit (not shown) of semiconductor devices such as a CMOS for controlling the phase change memory. Electrodes 202 formed on the insulating film 201 are made of, for example, tungsten or titanium nitride and includes a composite membrane thereof. The electrodes 202 connect the CMOS circuit and the selective elements of the phase change memory. Pin diodes 203 on the electrode 202 act as selective elements. The pin diode 203 is covered with a metal film (lower electrode) 204 containing metals such as tungsten. A phase change memory layer 205 having a superlattice structure is provided in contact with the metal film (lower electrode) 204. The phase change memory layer 205 having the superlattice structure is provided with a repeatedly laminated structure of the $Sb_2Te_3$ layer 101 containing Zn, the GeTe layer 102 formed on the $Sb_2Te_3$ layer 101, and the $Sb_2Te_3$ layer 103 as illustrated in FIGS. 1 and 2. Upper electrodes 206 are formed in contact with the phase change memory layer 205 having the superlattice structure. The phase change memory layer 205 having the superlattice structure includes a $Sb_2Te_3$ layer containing $ZrO_2$ or YSZ as a first layer, thereby controlling a resistance value in the phase change memory layer having the superlattice structure. The setting of a high resistance value can reduce the reset current, leading to lower power consumption.

The memory array in FIG. 4 can achieve a higher density.

Referring to FIGS. 5A to 5H, an example of a method of manufacturing the memory array in the phase change memory will be described below according to the present embodiment. FIGS. 5A to 5H are perspective views for explaining the method of manufacturing the memory array in the phase change memory according to the present embodiment.

Figure 5A:
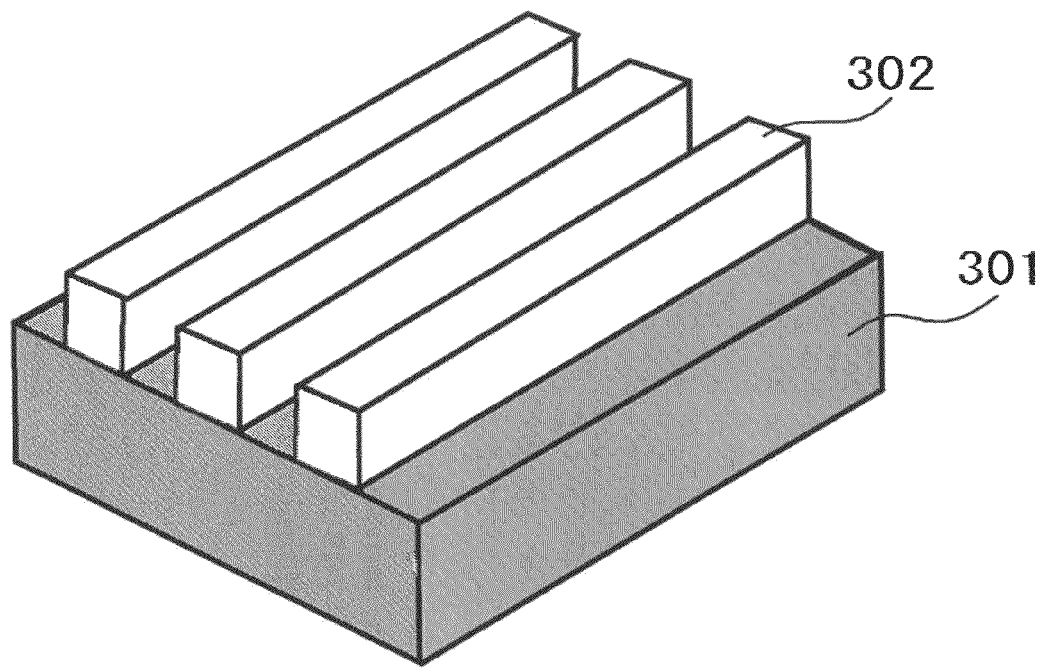
FIG. 5A is a perspective view for explaining (electrode formation) in a method of manufacturing a memory array in the phase change memory according to the first embodiment of the present invention.
Figure 5B:
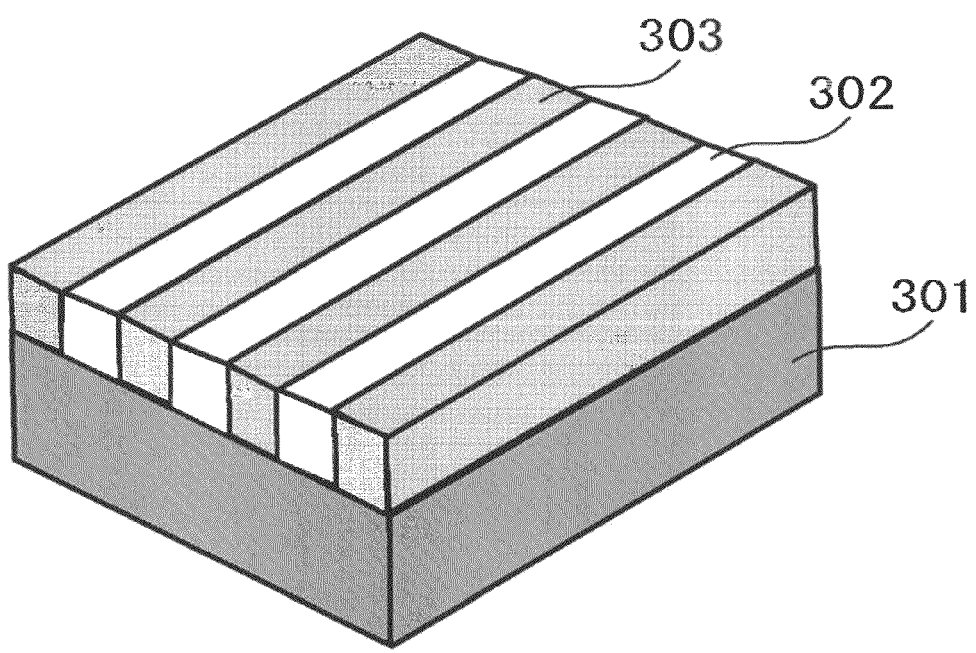
FIG. 5B is a perspective view for explaining (flattening of a formed insulating film) in the method of manufacturing the memory array in the phase change memory according to the first embodiment of the present invention.

First, an insulating film 301, e.g., a silicon oxide film is prepared. The insulating film 301 contains an embedded CMOS circuit that is produced on a silicon substrate by a known technique. On the insulating film 301, e.g., a silicon oxide film, refractory metals such as tungsten are deposited and then are processed by, for example, dry etching into electrodes 302 illustrated in FIG. 5A. After that, an insulating film, e.g., a silicon oxide film is deposited thereon by, for example, chemical vapor deposition (CVD) and is flattened by chemical mechanical polish (CMP), and then an insulating film 303 is embedded between the electrodes 302 (FIG. 5B).

Figure 5C:
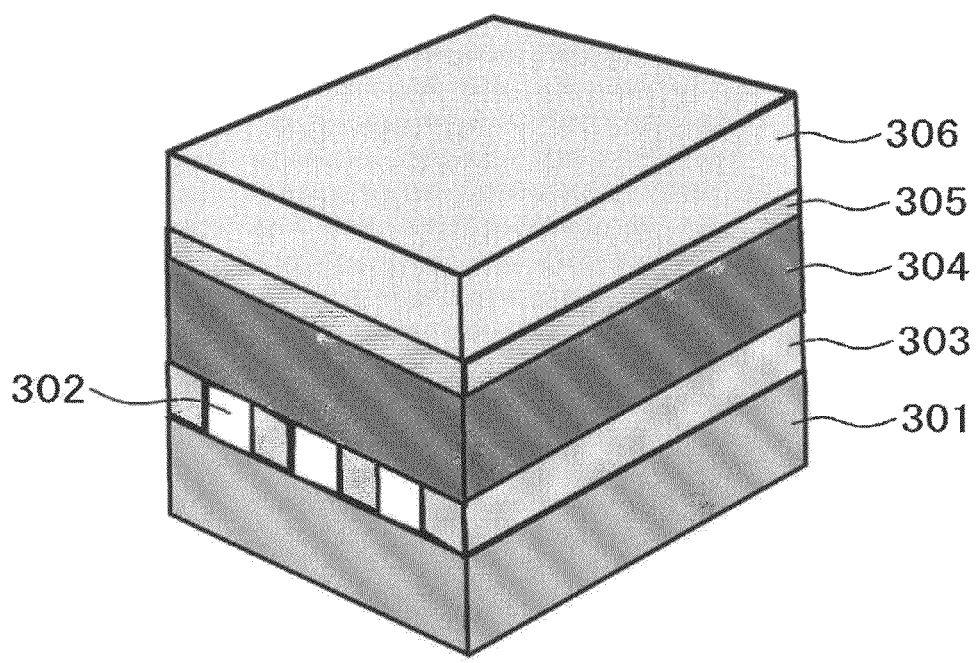
FIG. 5C is a perspective view for explaining the method of manufacturing the memory array in the phase change memory (a p-i-n laminated film, a metal film and a phase change memory layer in the superlattice structure are sequentially formed) according to the first embodiment of the present invention.

Subsequently, as shown in FIG. 5C, a laminated film 304 for a selecting switch, a metal film 305 acting as a lower electrode in the phase change memory layer having the superlattice structure, and a phase change memory layer 306 having a superlattice structure are sequentially formed. The laminated film 304 for a selecting switch includes a boron-doped silicon film, a silicon film of an intrinsic layer, and a phosphorus-doped silicon film that are sequentially formed by CVD. In the present embodiment, a pin diode is produced as a selective element. The selective element is optionally used. The selective element may be a diode produced in a silicon substrate, a MOS transistor, or a switch element called an ovonic threshold switch (OTS). A proper selective element is used in view of processability and a switching property.

After the silicon laminated film 304 for a selective element is optionally reformed by high-speed heat treatment or low-temperature heat treatment, the metal film 305 acting as the lower electrode in the phase change memory layer having the superlattice structure is formed by PVD or CVD. Refractory metals such as tungsten are selected for the metal film 305 acting as the low electrode.

For the phase change memory layer 306 having the superlattice structure, a $Sb_2Te_3$ layer containing $ZrO_2$ or YSZ is first formed by PVD or CVD, and then a GeTe layer and a $Sb_2Te_3$ layer are repeatedly formed a predetermined number of times (identical to a structure in FIG. 1).

Figure 5D:
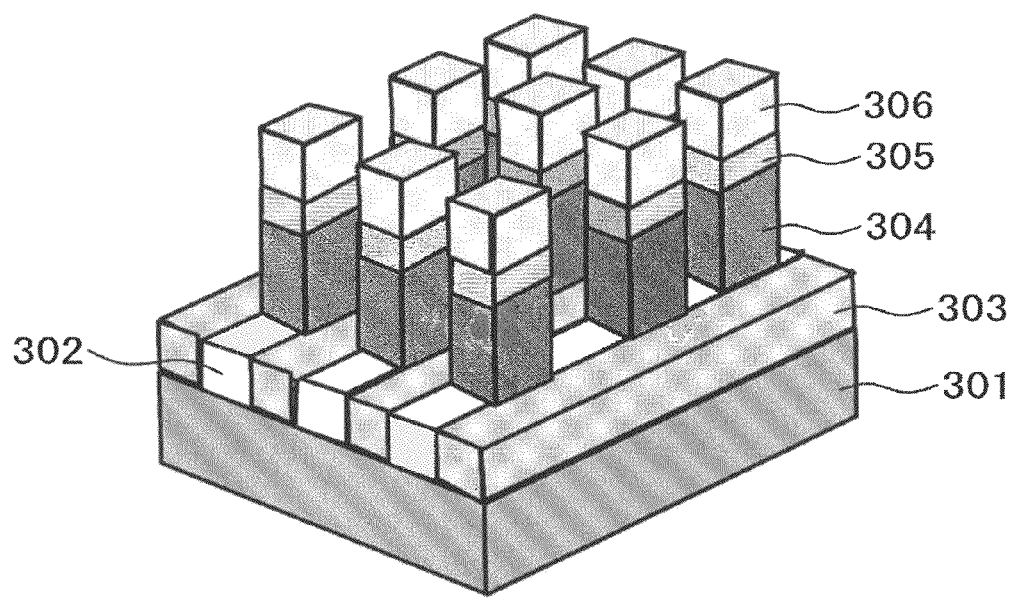
FIG. 5D is a perspective view for explaining the method of manufacturing the memory array in the phase change memory (the p-i-n laminated film, the metal film, and the phase change memory layer in the superlattice structure are processed into columns) according to the first embodiment of the present invention.

Subsequently, as shown in FIG. 5D, the laminated film 304 for a selecting switch, the metal film 305 acting as the lower electrode in the phase change memory layer having the superlattice structure, and the phase change memory layer 306 having the superlattice structure are cylindrically processed by lithography and dry etching. The processing may be performed in one step or multiple steps. The laminated film 304 for a selecting switch and the metal film 305 acting as the lower electrode in the phase change memory layer having the superlattice structure are processed in a self-aligning manner with respect to the phase change memory layer 306 having the superlattice structure. Thus, the laminated film 304 and the metal film 305 can be reduced in size.

Figure 5E:
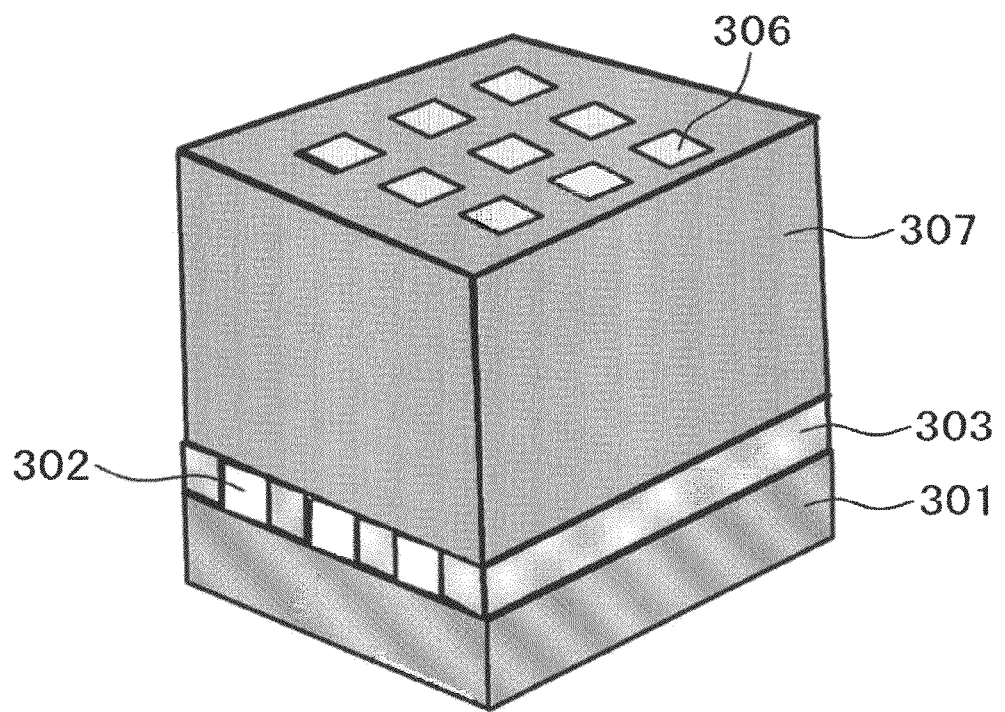
FIG. 5E is a perspective view for explaining the method of manufacturing the memory array in the phase change memory (flattening of the formed insulating film) according to the first embodiment of the present invention.

As shown in FIG. 5E, an insulating film having a large thickness is formed by CVD or spin coating, is polished by CMP, and then is flattened into an insulating film 307 that contains the laminated film 304 having a columnar structure for a selecting switch, the metal film 305 acting as the lower electrode in the phase change memory layer having the superlattice structure, and the phase change memory layer 306 having the superlattice structure.

Figure 5F:
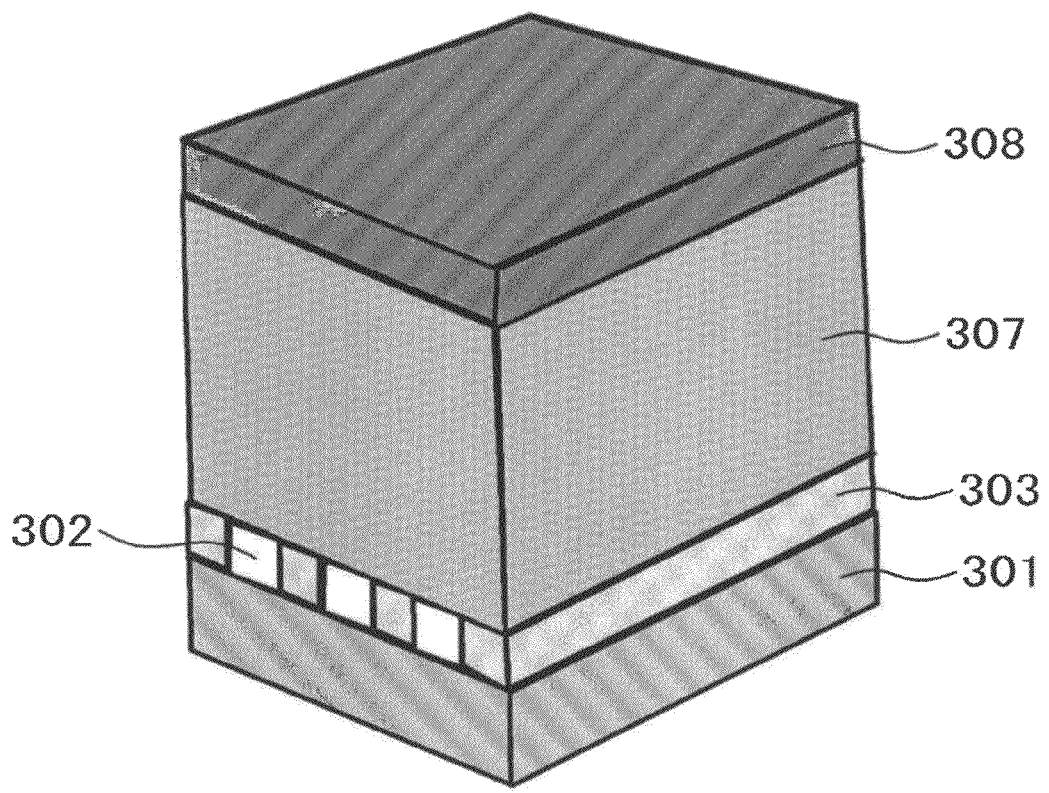
FIG. 5F is a perspective view for explaining the method of manufacturing the memory array in the phase change memory (the formation of the metal film) according to the first embodiment of the present invention.
Figure 5G:
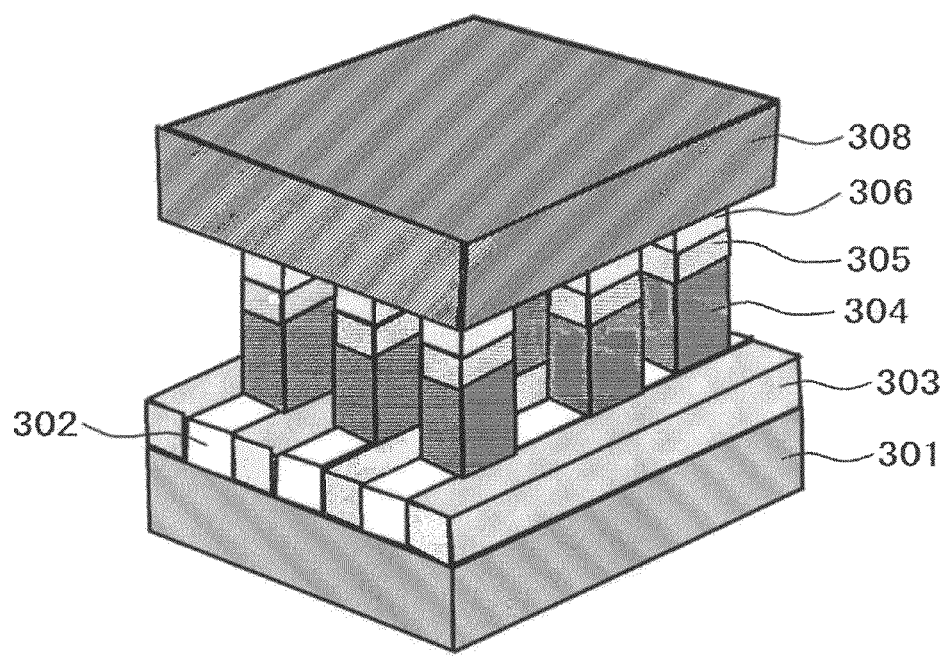
FIG. 5G is a perspective view for explaining the method of manufacturing the memory array in the phase change memory (a perspective view of the insulating film around a columnar structure in FIG. 5F) according to the first embodiment of the present invention.
Figure 5H:
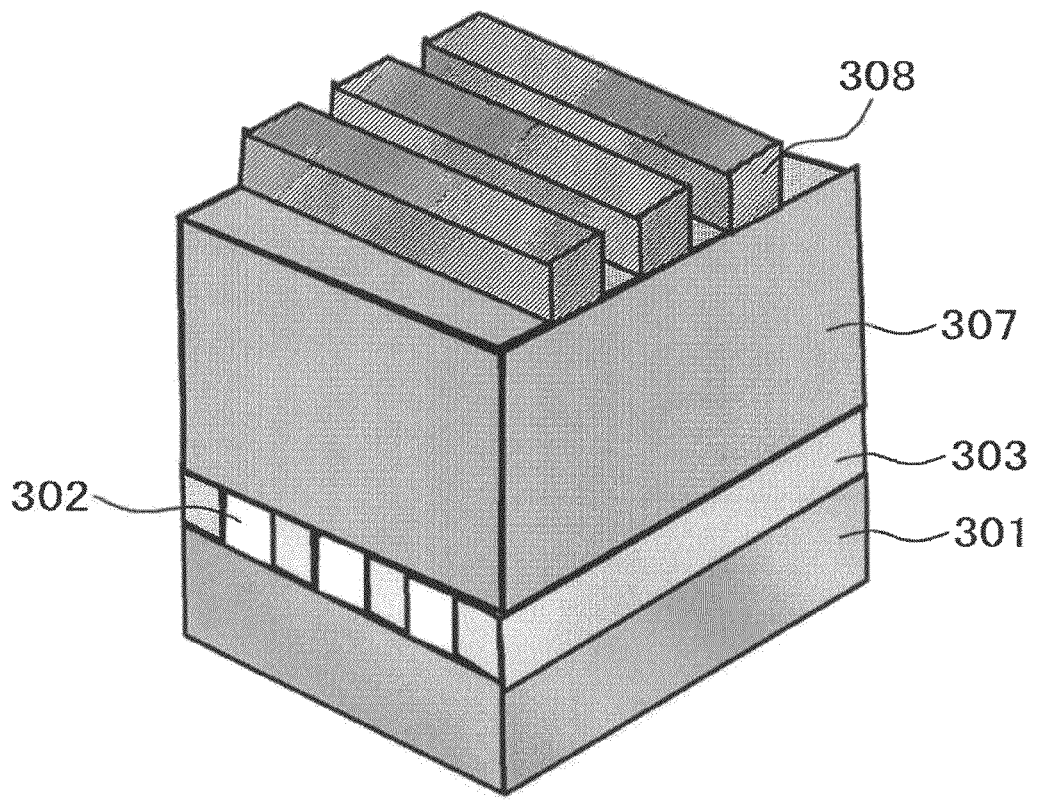
FIG. 5H is a perspective view for explaining the method of manufacturing the memory array in the phase change memory (the formation of an upper electrode) according to the first embodiment of the present invention.

Subsequently, as shown in FIG. 5F, a metal film 308 made of metals such as tungsten is formed thereon. FIG. 5G is a perspective view of the structure of the insulating film 307 in the structure of FIG. 5F. As shown in FIG. 5H, the metal film 308 is then processed into an upper electrode by lithography, dry etching, and so on, thereby obtaining a phase change memory array having selective elements. The phase change memory array includes the phase change device (the phase change memory layer having the superlattice structure) 306 that is a $Sb_2Te_3$ layer containing $ZrO_2$ or YSZ as a first layer, and GeTe layers and $Sb_2Te_3$ layers are repeatedly formed in the phase change memory layer. The setting of high resistivity in a low resistance state of the phase change memory can reduce a reset current, leading to lower power consumption. In other words, a memory can be obtained with a small rewriting current, low operating power, and high resistance to rewriting (endurance characteristic), thereby reducing operating power consumption with a high speed and a high density. Furthermore, the phase change memory can be easily optimized according to the processing conditions and a design modification of the phase change memory.

An evaluation of the electrical characteristics of the phase change memory device fabricated by the manufacturing method illustrated in FIGS. 5A to 5H proved that a resistance in a low resistance state can be increased without affecting reading in a low resistance state and a high resistance state, achieving lower power consumption.

The present embodiment can increase a resistance in a low resistance state while keeping lattice matching with a superlattice, thereby providing a superlattice phase change memory with lower power consumption. An amount Y of Zr to be added to the $Sb_2Te_3$ layer constituting the superlattice is expressed by $0\ wt\% < Y < 20\ wt\%$. Thus, a resistance value in a low resistance state can be controlled with higher controllability. The $Sb_2Te_3$ layer containing Zr has a thickness of 1 nm to 20 nm, achieving an excellent superlattice structure.

Second Embodiment

Referring to FIG. 2, a second embodiment of the present invention will be described below. Matters described in the first embodiment but not described in the present embodiment are applicable to the present embodiment unless otherwise specified.

FIG. 2 is a cross-sectional view illustrating a superlattice structure in a phase change memory according to the present embodiment. In the present embodiment, a superlattice layer in contact with an upper electrode 104 is a GeTe layer 102. Thus, even a metal having poor affinity with a $Sb_2Te_3$ layer can be used as the upper electrode.

As shown in FIGS. 3A and 3B, the addition of Zr to the $Sb_2Te_3$ layer can increase resistivity also in this structure. Thus, resistivity can be increased in a low resistance state in the superlattice structure, thereby obtaining a memory with a small rewriting current, low operating power, and high resistance to rewriting (endurance characteristic). Consequently, operating power consumption can be reduced with a high speed and a high density.

In the present embodiment, a superlattice can be produced in one step. Specifically, in the first embodiment, the $Sb_2Te_3$ layer is formed in a first step, and then a set of the GeTe layer and the $Sb_2Te_3$ layer is repeatedly formed in a second step. In the present embodiment, only a set of a $Sb_2Te_3$ layer and a GeTe layer is repeatedly formed.

The present embodiment can obtain the same effect as the first embodiment. Moreover, a metal having poor affinity with the $Sb_2Te_3$ layer can be used as an upper electrode.

The present invention includes various modifications and is not limited to the foregoing embodiments. For example, the foregoing embodiments were specifically described to explain the present invention. The present invention is not always limited to all the illustrated configurations. The configuration of one of the embodiments may be partly replaced with the configuration of the other embodiment. Alternatively, the configuration of one of the embodiments may be added to that of the other embodiment. Furthermore, a part of the configuration of the embodiment may contain another configuration, may be deleted, or may be replaced with another configuration,

What is claimed is:

1. A phase change memory comprising:
   a substrate having a semiconductor device and an insulating film on a surface of the substrate;
   a first electrode provided on the substrate;
   a second electrode provided on the first electrode; and
   a phase change memory layer having a superlattice structure between the first electrode and the second electrode, the superlattice structure including repeatedly formed layers of $Sb_2Te_3$ and GeTe,
   wherein the phase change memory layer having the superlattice structure is in contact with the first electrode and includes $Sb_2Te_3$ layers containing Zr.

2. The phase change memory according to claim 1, wherein the phase change memory layer having the superlattice structure includes one of the $Sb_2Te_3$ layers provided in contact with the second electrode.

3. The phase change memory according to claim 1, wherein the first electrode and the phase change memory layer having the superlattice structure are processed into columns, and the first electrode is processed in a self-aligning manner with respect to the phase change memory layer having the superlattice structure.

4. The phase change memory according to claim 1, wherein an $Sb_2Te_3$ layer containing Zr in contact with the first electrode has a thickness of 1 nm to 20 nm.

5. The phase change memory according to claim 1, further comprising a selective element between the substrate and the first electrode.

6. The phase change memory according to claim 1, wherein all of the $Sb_2Te_3$ layers contain Zr.

7. The phase change memory according to claim 1, wherein each $Sb_2Te_3$ layer containing Zr as expressed below:

$0 \text{ wt\%} < Y < 20 \text{ wt\%}$ where Y is an added amount of Zr.

8. A phase change memory comprising:
   a first electrode;
   a phase change memory layer having a superlattice structure on the first electrode, the phase change memory layer including repeatedly formed layers of $Sb_2Te_3$ and GeTe; and
   a second electrode formed on the phase change memory layer having the superlattice structure,
   wherein the phase change memory layer having the superlattice structure includes an $Sb_2Te_3$ layer in contact with the first electrode and a GeTe layer in contact with the second electrode, and
   at least one of the $Sb_2Te_3$ layers contains Zr.

9. The phase change memory according to claim 8, wherein the $Sb_2Te_3$ layer containing Zr is the $Sb_2Te_3$ layer in contact with the first electrode.

10. The phase change memory according to claim 8, wherein the $Sb_2Te_3$ layer containing Zr is one of the $Sb_2Te_3$ layers out of contact with the first electrode.

11. The phase change memory according to claim 8, wherein the Zr is uniformly distributed within the $Sb_2Te_3$ layer.

12. The phase change memory according to claim 8, wherein the $Sb_2Te_3$ layer containing Zr has a thickness of 1 nm to 20 nm.

13. The phase change memory according to claim 8, wherein the $Sb_2Te_3$ layer containing Zr contains Zr as expressed below:

$0 \text{ wt\%} < Y < 20 \text{ wt\%}$ where Y is an added amount of Zr.

14. The phase change memory according to claim 8, wherein the first electrode is connected to a selective element.

15. The phase change memory according to claim 14, wherein the selective element, the first electrode, and the phase change memory layer having the superlattice structure are processed into columns in an array.

* * * * *